(12) United States Patent
Joo et al.

(10) Patent No.: US 11,092,546 B2
(45) Date of Patent: Aug. 17, 2021

(54) SPECTROMETER UTILIZING SURFACE PLASMON

(71) Applicants: Samsung Electronics Co., Ltd., Suwon-si (KR); The Regents of the University of California, Oakland, CA (US)

(72) Inventors: Wonjae Joo, Seongnam-si (KR); Jie Yao, Berkeley, CA (US); Xi Wang, Berkeley, CA (US)

(73) Assignee: Samsung Electronics Co., Ltd., Suwon-s (KR)

( * ) Notice: Subject to any disclaimer, the term of this patent is extended or adjusted under 35 U.S.C. 154(b) by 255 days.

(21) Appl. No.: 16/224,466

(22) Filed: Dec. 18, 2018

(65) Prior Publication Data

US 2019/0195793 A1    Jun. 27, 2019

Related U.S. Application Data

(60) Provisional application No. 62/609,907, filed on Dec. 22, 2017.

(51) Int. Cl.
| | |
|---|---|
| *G01N 21/552* | (2014.01) |
| *H01L 31/0232* | (2014.01) |
| *H01L 21/24* | (2006.01) |
| *H01L 31/0392* | (2006.01) |
| *H01L 31/028* | (2006.01) |

(52) U.S. Cl.
CPC ........... *G01N 21/553* (2013.01); *H01L 21/24* (2013.01); *H01L 31/0232* (2013.01); *H01L 31/028* (2013.01); *H01L 31/03921* (2013.01)

(58) Field of Classification Search
CPC ................ G01N 21/553; G01N 21/554; H01L 31/0232; H01L 31/0263; H01L 21/26513; H01L 21/24
See application file for complete search history.

(56) References Cited

U.S. PATENT DOCUMENTS

| | | | |
|---|---|---|---|
| 7,015,471 B2* | 3/2006 | Franzen | G01N 21/553 250/338.1 |
| 2015/0168300 A1* | 6/2015 | Peterson | G02B 21/0076 356/445 |

FOREIGN PATENT DOCUMENTS

| | | | | |
|---|---|---|---|---|
| CN | 105403528 A | | 3/2016 | |
| KR | 10-1722396 B1 | | 2/2017 | |
| WO | WO-2018011035 A1 | * | 1/2018 | ............ G01J 3/0259 |

OTHER PUBLICATIONS

Yuan et al "Dynamic trapping of terahertz waves by silicon-filled metallic grating structure," *Optics Communications*, 332, pp. 132-135 (2014).

(Continued)

*Primary Examiner* — Rebecca C Bryant
(74) *Attorney, Agent, or Firm* — Leydig, Voit & Mayer, Ltd.

(57) ABSTRACT

Provided are spectrometers utilizing surface plasmons and surface plasmon resonance. The spectrometer includes a substrate including a region having a permittivity slope (varying permittivity), a dielectric spacer configured to correspond to the region having a permittivity slope, and a detector configured to face the region having a permittivity slope with the dielectric spacer therebetween. The region having a permittivity slope includes a region having a dopant concentration slope (varying concentration).

19 Claims, 3 Drawing Sheets

(56) References Cited

OTHER PUBLICATIONS

Guo et al. "Slowing and trapping THz waves system based on plasmonic graded period grating," *J. Opt*, 45(1), pp. 50-57 (2016).
Kyotoku et al. "Sub-nm resolution cavity enhanced micro-spectrometer," *Optics Express*, vol. 18, No. 1 (2010).
Calafiore et al. "Holographic planar lightwave circuit for on-chip spectroscopy," *Light: Science & Applications* (2014).
Xia et al. "High resolution on-chip spectroscopy based on miniaturized microdonut resonators," *Optics Express*, vol. 19, No. 13 (2011).
Redding et al. "Compact spectrometer based on a disordered photonic chip," *Nature Photonics*, vol. 7 (2013).
D. M. Szmyd et al., "Heavily doped GaAs:Se. I. Photoluminescence determination of the electron effective mass," *J. Appl. Phys*, 68(5), pp. 2367-2375 (1990).
V. V. Karataev et al., "Compensation in n-type InAs,", *Sov. Phys. Semicond.*, 11(9), pp. 1009-1011 (1977).
R.R. Senechal, "Redetermination of the Effective Mass in Heavily-Doped n-Type InAs," *Phys. Stat. sol* (*b*) 59, pp. k35-K37 (1973).
Electronics Letters, vol. 10, No. 13, Downloaded on Dec. 3, 2020 at 8:32 UTC from IEEE Xplore (1974).
W. Zawadzki et al., "Electron transport phenomena in small-gap semiconductors," *Advances in Physics*, 23(3), pp. 435-522 (1974).
Fourier Transform Infra-Red Spectrophotometer (FTIR), published on Aug. 11, 2015.

\* cited by examiner

[FIG. 1]
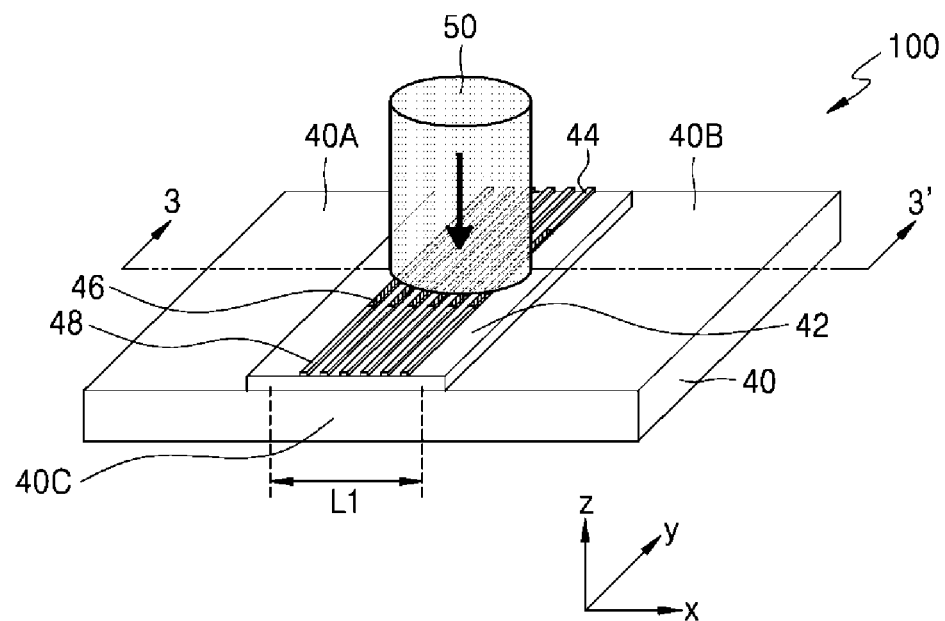
[FIG. 2]
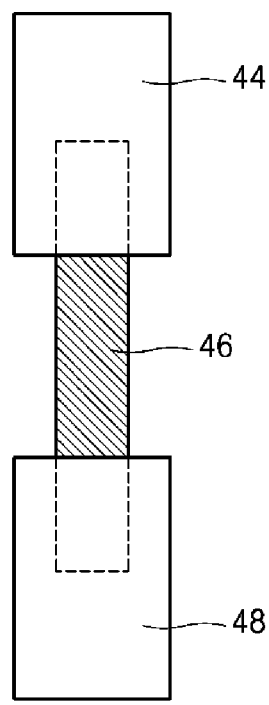

[FIG. 3]
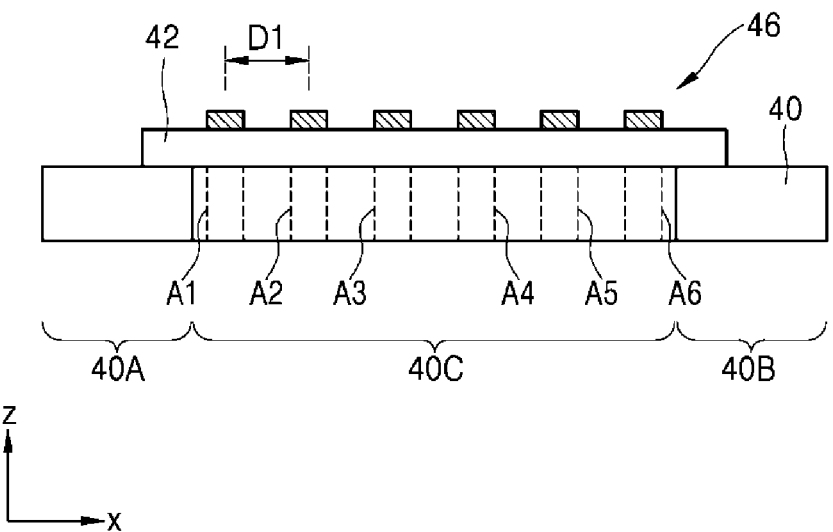
[FIG. 4]
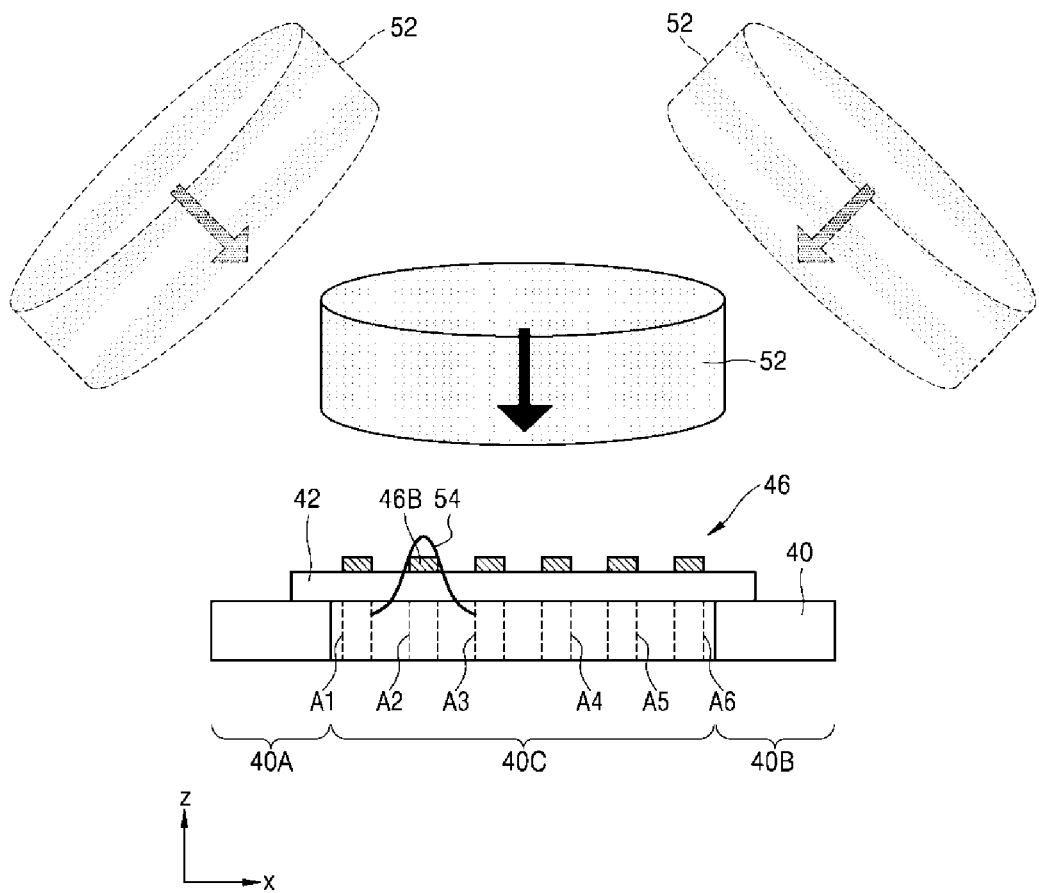

[FIG. 5]
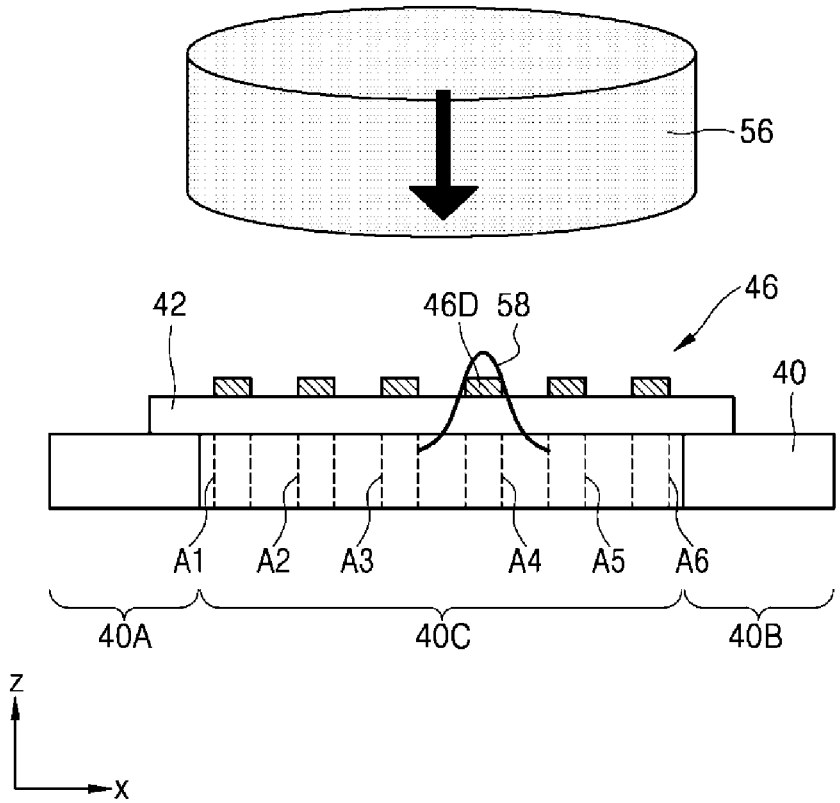
[FIG. 6]
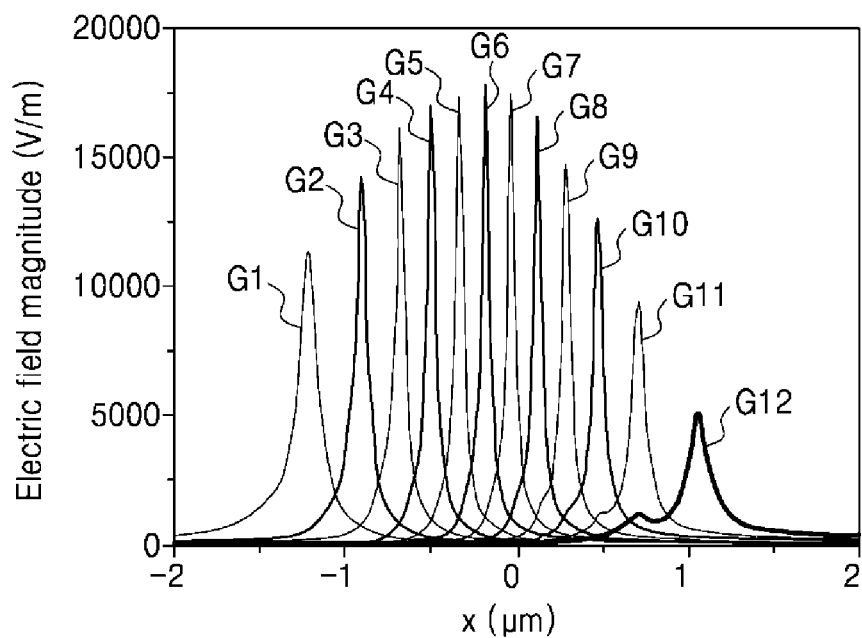

SPECTROMETER UTILIZING SURFACE PLASMON

CROSS-REFERENCE TO RELATED APPLICATION

This application claims the benefit of U.S. Provisional Application No. 62/609,907, filed on Dec. 22, 2017, in the United States Patent and Trademark Office, the disclosure of which is incorporated herein in its entirety by reference.

BACKGROUND

The present disclosure relates to spectrometers, and more particularly, to spectrometers utilizing surface plasmons and surface plasmon resonance.

A spectrometer is an apparatus for observing and analyzing a spectrum of light with the eyes by dispersing light. The spectrometer is also used for understanding a structure and components of a material that emits or absorbs light. The spectrometer includes a prism spectrometer that uses a prism, a lattice spectrometer that uses a diffraction lattice, and an interference spectrometer that uses light interference. A spectrometer of the related art includes optical elements, such as a prism, a diffraction lattice, or a moving mirror for a spectrum. There is a need for miniaturization of the optical elements for miniaturization of the spectrometer.

SUMMARY

Some example embodiments include spectrometers that utilize surface plasmons and surface plasmon resonance, may be miniaturized in an on-chip type, and may be free from an incident angle of light.

Additional aspects will be set forth in part in the description which follows and, in part, will be apparent from the description, or may be learned by practice of the presented example embodiments.

According to some example embodiments, there is provided a spectrometer utilizing surface plasmons and surface plasmon resonance, the spectrometer including: a substrate including a region having a permittivity slope; a dielectric spacer configured to correspond to the region having a permittivity slope; and a detector configured to face the region having a permittivity slope with the dielectric spacer therebetween.

The region having a permittivity slope may include a region having a dopant concentration slope.

The substrate may include a semiconductor material.

An entire region of the substrate may be a region including the permittivity slope.

The detector may be an optical current detector.

The detector may include at least a two-dimensional (2D) material.

The detector may include a plurality of nano-graphene strips arranged directly on the dielectric spacer. Both ends of each of the nano-graphene strips may be connected to contact units. The contact units may include an Au thin film or an Ag thin film.

The substrate may include: a first region having a first given dopant concentration slope; a second region having a second given dopant concentration slope; and a third region between the first region and the second region, wherein the third region includes a region having a permittivity slope. The region having a permittivity slope may have a dopant concentration slope. The dopant concentrations of the first region and the second region may be different from each other.

According to an example embodiment, a spectrometer is provided that uses surface plasmons and surface plasmon resonance. The spectrometer includes a substrate including a first region having a varying permittivity, wherein the varying permittivity varies from a first permittivity to a second permittivity in the first region, a detector adjacent to and facing the first region, and a dielectric spacer positioned between the substrate and the detector, the dielectric spacer having a dimension (e.g., width and length) corresponding to at least a dimension (e.g., width and length) of the region having the varying permittivity.

In certain aspects, the first region includes a plurality of doping regions, each successive region of the plurality of doping regions having an increased dopant concentration relative to a prior region of the plurality of doping regions along a first direction. In certain aspects, each of the plurality of doping regions is spaced apart from a successive doping region along the first direction by a gap. The gaps between each doping region may have a same length/size or different lengths/sizes.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

These and/or other aspects will become apparent and more readily appreciated from the following description of the example embodiments, taken in conjunction with the accompanying drawings in which:

FIG. 1 is a perspective view of a spectrometer utilizing surface plasmons and plasmon resonance, according to some example embodiments;

FIG. 2 is a plan view of a unit detector including one detector and contact units connected to both ends of the one detector in the spectrometer of FIG. 1;

FIG. 3 is a cross-sectional view taken along line 3-3' of FIG. 1;

FIG. 4 is a cross-sectional view showing the generation of increased light energy on a first location of a boundary between a substrate and a dielectric when light having a first wavelength $\lambda 1$ enters a spectrometer according to an example embodiments;

FIG. 5 is a cross-sectional view showing the generation of increased light energy on a second location of a boundary between a substrate and a dielectric when light having a second wavelength $\lambda 2$ enters a spectrometer according to an example embodiment; and FIG. 6 is a graph showing the change of locations of increased electric fields according to the frequency of incident light in a spectrometer utilizing surface plasmon resonance, according to an example embodiment.

DETAILED DESCRIPTION

Hereinafter, embodiments of spectrometers utilizing surface plasmon resonance will now be described in detail, examples of which are illustrated in the accompanying drawings. In the drawings, thicknesses of layers or regions may be exaggerated for clarity of the specification.

FIG. 1 is a perspective view of a spectrometer 100 utilizing surface plasmon, according to an example embodiment.

Referring to FIG. 1, the spectrometer 100 utilizing surface plasmon resonance may include a substrate 40, a dielectric spacer 42, detectors 46, and first and second contact units 44 and 48. The substrate 40 may include a region having a negative permittivity slope in a length direction (an x-axis direction). An entire region in the length direction of the substrate 40 may have a negative permittivity slope, or only a region 40C in the length direction of the substrate 40 may have the negative permittivity slope. For example, the substrate 40 may be a semiconductor layer doped with a p-type dopant or an n-type dopant. In this case, the substrate 40 may be a substrate in which a dopant is doped in the region 40C in the length direction of the substrate 40. The dopant concentration of the region 40C may have a slope in the length direction of the substrate 40. That is, the dopant concentration of the region 40C may increase or decrease in the x-axis direction. The doping of the dopant in the substrate 40 may be performed in an entire region of the substrate 40. In this case, the doping of a dopant in the substrate may be performed in a given direction, for example, may be performed to have a dopant-concentration slope from one end to the other end in the length direction (the x-axis direction) of the substrate 40.

The substrate 40 may be divided into a first region 40A, a second region 40B, and a third region 40C according to the dopant concentration. The first region 40A, the second region 40B, and the third region 40C may not be externally divided or may not have a boundary that is physically exposed, but divided for convenience of explanation. The first region 40A may be a region in which the dopant concentration is relatively low. The second region 40B may be a region in which the dopant concentration is relatively high, and may have the same or a different dopant concentration as the first region 40A. The third region 40C is a region having a negative permittivity slope and may have a dopant concentration slope (e.g., continuously varying in concentration along a length direction, e.g., the x-axis, or varying in a step-wise manner). The third region 40C is arranged between the first region 40A and the second region 40B. The third region 40C may have a length L1 in the length direction of the substrate 40. The third region 40C may have a dopant concentration slope in which the dopant concentration gradually increases from the first region 40A toward the second region 40B. The dopant concentration may vary (e.g., increase or decrease) linearly, or in a step-wise fashion, or otherwise, along the length direction. When the relative dopant concentrations of the first region 40A and the second region 40B are different from each other, a pattern of the dopant concentration slope of the third region 40C may also be changed.

The doping of the first region 40A, the second region 40B, and the third region 40C of the substrate 40 may be performed using a molecule beam epitaxy method, an ion diffusion method, or an ion implantation method or another method as suitable.

The substrate 40 may be an InSb substrate or an InAs substrate, but the present embodiment is not limited thereto. The substrate 40 may also be a GaAs substrate, an InP substrate, or a GaSb substrate. The dopant concentration of the substrate 40 may be in a range of from about 1e17 cm$^{-3}$ to about 1e22 cm$^{-3}$. An example of the dopants for doping the substrate 40 may include Be, Zn, or Si. The third region 40C of the substrate 40 may have a dopant concentration slope within the dopant concentration range described above.

The dielectric spacer 42 is arranged on at least a region of a surface of the substrate 40. For example, the dielectric spacer 42 is arranged on a region of an upper surface of the substrate 40. The dielectric spacer 42 may be arranged on a region corresponding to the third region 40C of the substrate 40. The dielectric spacer 42 may have a width corresponding to at least the length L1 of the third region 40C and may cover the third region 40C of the substrate 40 in the y-axis direction. The dielectric spacer 42 may cover an entirety of the third region 40C of the substrate 40. The dielectric spacer 42 may directly contact the substrate 40. The whole or a portion of a dielectric used for forming a surface plasmon together with a metal may be used as the dielectric spacer 42.

A surface plasmon may appear at an interface between the substrate 40 and the dielectric spacer 42 by incident light 50. The surface plasmon may generate a plasmon resonance at a location where absolute values of the permittivity of the dielectric spacer 42 and the permittivity of the substrate 40 are equal. As a result, a locally increased electric field is generated at the location where the absolute values of the permittivity of the dielectric spacer 42 and the permittivity of the substrate 40 are equal.

As a result, light energy may be concentrated on a given local region of a boundary between the substrate 40 and the dielectric spacer 42, and thus, a spot that is brighter than a surrounding area may be formed. The spot may have a size in a range from about 10 nm to about 1000 nm or greater. The generated increased light energy may be detected by the detectors 46. For this purpose, the detectors 46 are arranged on the dielectric spacer 42 in an embodiment. Since the detectors 46 are configured to detect increased light energy or the bright spot, the detectors 46 may be arranged on locations where the increased light energy is generated.

The third region 40C of the substrate 40 is a region having a negative permittivity slope, that is, a dopant concentration slope, and thus, the location where the absolute values of the permittivity of the dielectric spacer 42 and the permittivity of the substrate 40 are equal may be plural in number according to a wavelength of the incident light 50. Accordingly, the detectors 46 arranged on the dielectric spacer 42 may be arranged in one-to-one correspondence to the plural locations where the absolute values of the permittivity of the dielectric spacer 42 and the permittivity of the substrate 40 are equal. The detectors 46 may be arranged parallel to each other or may have different relative orientations. The detectors 46 may be detectors that generate signal, e.g., an optical current, in response to the increased electric field or the bright spot. The detectors 46 may include, for example, graphene or a two-dimensional material having a physical property similar to graphene. For example, each of the detectors 46 may include a nano-strip. The dielectric spacer 42 may have a sufficiently small thickness so that the increased electric field is able to reach the detectors 46 arranged on the dielectric spacer 42. The detectors 46 may be formed by forming a thin film for the detectors 46 on the dielectric spacer 42 and patterning the thin film using a predetermined patterning process, for example, an e-beam lithography method.

In an embodiment, the detectors 46 are arranged on a region of the dielectric spacer 42. A first contact unit 44 is located proximal to an end of each of the detectors 46, and a second contact unit 48 is located proximal to the other end of each of the detectors 46. An entirety of each of the detectors 46 and the first and second contact units 44 and 48 located on the both ends of each of the detectors 46 may form a line type or a strip type. As an example, the first contact units 44 adjacent to each other may be parallel to each other, and the second contact units 48 adjacent to each other may also be parallel to each other. When there is a potential difference between the first and second contact units 44 and 48, the increased light energy generated between the first and second contact units 44 and 48 may be converted to an optical current in each of the detectors 46. A single first contact unit 44, a single second contact unit 48, and a single detector 46 may be referred to as a single detector or a single detection unit. In a broad sense, all or a portion of the detectors 46 arranged on the dielectric spacer 42 and the first and second contact units 44 and 48 may be referred to collectively as a detector.

FIG. 2 is a plan view of a single detector (single detection unit) of FIG. 1.

Referring to FIG. 2, as described above, a single detection unit may include one detector 46 and one first contact unit 44 and one second contact unit 48 respectively connected to the both ends of the one detector 46. A portion of a side of the detector 46 is covered by the first contact unit 44, and a portion of the other side of detector 46 is covered by the second contact unit 48. The first contact unit 44 may be a conductive layer or a conductive pad layer, and comprising a conductive material. The second contact unit 48 may be a conductive layer or a conductive pad layer. As an example, the first contact unit 44 may be a thin Au film or a thin Ag film. As an example, the second contact unit 48 may be a thin Au film or a thin Ag film. In an embodiment, the first and second contact units 44 and 48 may be formed of the same conductive material. In another embodiment, the first and second contact units 44 and 48 may be formed of different conductive materials from each other.

In FIG. 2, it is depicted that both ends of the detector 46 are covered by the first and second contact units 44 and 48, but in another embodiment, both ends of the detector 46 may be formed on the first and second contact units 44 and 48.

FIG. 3 is a cross-sectional view taken along line 3-3' of FIG. 1, that is, in a perpendicular direction to the detectors 46.

In FIG. 3, reference numerals A1 through A6 indicate distinct regions doped with specific dopant concentrations in the third region 40C of the substrate 40 having a dopant concentration slope. In an embodiment, the first doped region A1 may be doped with a dopant concentration of 1e17, the second doped region $\lambda 2$ may be doped with a dopant concentration of 1e18, the third doped region A3 may be doped with a dopant concentration of 1e19, the fourth doped region A4 may be doped with a dopant concentration of 1e20, the fifth doped region A5 may be doped with a dopant concentration of 1e21, and the sixth doped region A6 may be doped with a dopant concentration of 1e22. In describing the dopant concentrations, for convenience, the unit ($cm^{-3}$) of the dopant concentration values is omitted.

Referring to FIG. 3, a plurality of the detectors 46 are arranged on regions of the dielectric spacer 42 corresponding to the third region 40C of the substrate 40. The detectors 46 are in one-to-one correspondence to the first through sixth doped regions A1 through A6. The detectors 46 are arranged directly above the corresponding first through sixth doped regions A1 through A6 with the dielectric spacer 42 therebetween. The detectors 46 are arranged with certain gaps D1 between. In an embodiment, the gaps D1 between the detectors 46 may be constant (i.e. have a same length between each detector). In another embodiment, the gaps D1 between the detectors 46 may be different. The lengths of the gaps D1 between the detectors 46 may be, for example, in a range of about 10 nm to about 1 μm.

FIG. 4 is a cross-sectional view showing the generation of increased light energy, that is, a spot on a given location of a boundary between the substrate 40 and the dielectric spacer 42 when incident light 52 having a first wavelength $\lambda 1$ enters a spectrometer according to an example embodiment. The first wavelength $\lambda 1$ may be, for example, a wavelength in the visible light band or in the infrared ray band or other wavelength band.

Referring to FIG. 4, an absolute value of the permittivity of the dielectric spacer 42 becomes equal to the absolute value of the permittivity of the second doped region $\lambda 2$ of the substrate 40 with respect to the incident light 52 having a first wavelength $\lambda 1$. Accordingly, surface plasmon resonance occurs at an interface between the second doped region $\lambda 2$ of the substrate 40 and the dielectric spacer 42. As a result, increased light energy 54 is generated at the interface between the second doped region $\lambda 2$ of the substrate 40 and the dielectric spacer 42. The increased light energy 54 reaches a detector 46B corresponding to the second doped region $\lambda 2$ of the substrate 40. Accordingly, the increased light energy 54 is converted to an optical current through the detector 46B. That is, the increased light energy 54 may be detected through the detector 46B. In this manner of detection, information about light components included in the incident light 52 may be obtained. Thus, when the incident light 52 is light taken from a specific sample, information about the specific sample may be obtained through the detection of the increased light energy.

Meanwhile, the generation of the increased light energy 54 is related to the wavelength $\lambda 1$ of the incident light 52 and a dopant concentration slope of the substrate 40. The generation of the increased light energy 54 is not related to an incident angle of the incident light 52. Accordingly, the increased light energy 54 may be generated even though the incident light 52 enters from either the left or right side of the spectrometer 100. Therefore, the spectrometer 100 according to the example embodiment may operate independently from the incident angle of the incident light 52.

FIG. 5 is a cross-sectional view showing generation of increased light energy on a given location of a boundary between the substrate 40 and the dielectric spacer 42 when incident light 52 having a second wavelength $\lambda 2$ enters a spectrometer according to an example embodiment. The second wavelength $\lambda 2$ is different from the first wavelength $\lambda 1$. The second wavelength $\lambda 2$ may be, for example, a wavelength of the visible light band or the infrared ray band or other wavelength band.

Referring to FIG. 5, in the case that an absolute value of the permittivity of the dielectric spacer 42 and an absolute value of the permittivity of the fourth doped region A4 of the substrate 40 are equal when incident light 56 has a second wavelength $\lambda 2$, surface plasmon resonance occurs at an interface between the fourth doped region A4 of the substrate 40 and the dielectric spacer 42. As a result, increased light energy 58 is generated at the interface between the fourth doped region A4 of the substrate 40 and the dielectric spacer 42. The increased light energy 58 reaches a detector 46D corresponding to the fourth doped region A4 of the substrate 40. Accordingly, an optical current due to the increased light energy 58 may be detected through the detector 46D. Like the case of FIG. 4, light components included in the incident light 56 may be obtained through the detection, and when the incident light 56 is light taken from a specific sample, information about the specific sample may be obtained through the detection of the increased or enhanced light energy.

In the cases of FIGS. 4 and 5, the incident lights 52 and 56 having one light component are depicted, however, a plurality of light components may be included in the incident lights 52 and 56.

For example, when the incident light 56 includes both the first and second wavelengths λ1 and λ2, the surface plasmon resonances may occur at interfaces between the second and fourth doped regions A2 and A4 of the substrate 40 and the dielectric spacer 42. Accordingly, increased light energy is generated at the interface between the second doped region λ2 of the substrate 40 and the dielectric spacer 42, and is also generated at the interface between the fourth doped region A4 of the substrate 40 and the dielectric spacer 42. That is, the increased light energy may be simultaneously generated in two locations between the substrate 40 and the dielectric spacer 42. Accordingly, optical currents may be detected by the detector 46B corresponding to the second doped region λ2 and by the detector 46D corresponding to the fourth doped region A4. The detection results may be compared with reference data of optical current-wavelength detected through the plurality of detectors 46, and thus, information for light components included in the incident light 56 may be obtained.

FIG. 6 is a graph showing the change of locations of increased light energy due to surface plasmon resonance according to the frequency of incident light in a spectrometer utilizing surface plasmon resonance, according to an example embodiment of the disclosure.

In FIG. 6, the horizontal axis indicates locations on a surface of a substrate having a dopant concentration slope, and the vertical axis indicates the intensity of the fields.

In FIG. 6, a first graph G1 represents a pulse of an electric field generated when a frequency of incident light is 20 THz. A second graph G2 represents a pulse of an electric field generated when a frequency of the incident light is 21 THz. Also, third through twelfth graphs G3 through G12 represent pulses of electric fields when frequencies of the incident light are 22 THz through 31 THz, respectively.

Referring to FIG. 6, it is seen that the location of an increased electric field, that is, the pulse of an electric field, is changed according to a frequency of the incident light.

The results of FIG. 6 may denote that, when an optical current detector is arranged on a location where a pulse of an electric field appears, an optical current may be detected, and, from the detected optical current, light components included in the incident light may be obtained or determined.

Next, simulation results with respect to spectrometers according to an example embodiment will now be described.

Four spectrometers corresponding to the spectrometer utilizing surface plasmon resonance according to the present embodiment were manufactured for the simulations.

The four spectrometers were divided according to used substrates and dopant concentration slopes.

Of the four spectrometers, a first spectrometer uses an InAs substrate as a substrate, and a region of the InAs substrate having a dopant concentration slope has a dopant concentration range of $2e18$ $cm^{-3}$ to $1e19$ $cm^{-3}$. A second spectrometer uses the InAs substrate and a region of the InAs substrate having a dopant concentration slope has a dopant concentration range of $1e16$ $cm^{-3}$ to $1e17$ $cm^{-3}$.

Of the four spectrometers, a third spectrometer uses an InSb substrate as a substrate, and a region of the InSb substrate having a dopant concentration slope has a dopant concentration range of $2e18$ $cm^{-3}$ to $1e19$ $cm^{-3}$.

Of the four spectrometers, a fourth spectrometer uses an InSb substrate as a substrate, and a region of the InSb substrate having a dopant concentration slope has a dopant concentration range of $1e16$ $cm^{-3}$ to $1e17$ $cm^{-3}$.

Incident light having a frequency range of 12 THz to 21 THz was irradiated onto the first spectrometer. Incident light having a frequency range of 1.6 THz to 3.8 THz was irradiated onto the second spectrometer. Incident light having a frequency range of 15 THz to 26 THz was irradiated onto the third spectrometer. Incident light having a frequency range of 2.2 THz to 5.2 THz was irradiated onto the fourth spectrometer.

Also, in the simulations, lengths L1 of the regions having the dopant concentration slope of the first through fourth spectrometers are divided to 1 μm, 4 μm, and 8 μm.

Table 1 below shows the simulation results.

TABLE 1

| Spectrometer | substrate | Dopant concentration ($cm^{-3}$) | Frequency of incident light (THz) | Size of GNM region (μm) | Average amplitude enhancement | Frequency resolution (THz) | Spatial resolution (nm) |
|---|---|---|---|---|---|---|---|
| First spectrometer | InAs | 2e18~1e19 | 12~21 | 1 | >22 | 0.45 | ~40 |
|  |  |  |  | 4 | >16 | 0.45 | ~140 |
|  |  |  |  | 8 | >12 | 0.45 | ~240 |
| Second spectrometer | InAs | 1e16~1e17 | 1.6~3.8 | 1 | >5 | 0.6 | ~140 |
|  |  |  |  | 4 | >3.6 | 0.6 | ~560 |
|  |  |  |  | 8 | >2.4 | 0.6 | ~1000 |
| Third spectrometer | InSb | 2e18~1e19 | 15~26 | 1 | >16 | 0.6 | ~40 |
|  |  |  |  | 4 | >10 | 0.6 | ~180 |
|  |  |  |  | 8 | >8 | 0.6 | ~280 |
| Fourth spectrometer | InSb | 1e16~1e17 | 2.2~5.2 | 1 | >5 | 0.45 | ~70 |
|  |  |  |  | 4 | >4 | 0.45 | ~340 |
|  |  |  |  | 8 | >3 | 0.45 | ~600 |

In Table 1, the dopant concentration indicates a dopant concentration range of a region having a dopant concentration slope. For example, a range of $2e18$ $cm^{-3}$ to $1e19$ $cm^{-3}$ may denote that a dopant concentration of a region having a dopant concentration slope changes from $2e18$ $cm^{-3}$ to $1e19$ $cm^{-3}$ from an end to the other end of the region.

The size of the GNM region may denote a size (length) of the region having a dopant concentration slope. The average amplitude enhancement indicates how much the brightness of the increased electric field is greater than that of ambient light. For example, ">22" may denote that the intensity of the increased electric field that occurred due to surface plasmon resonance at an interface between a substrate and a dielectric spacer is greater than 22 times the intensity of an electric field that occurred due to ambient light. That is, the brightness due to the increased electric field is 22 times greater than the brightness due to the ambient light. The frequency resolution may denote a frequency gap between incident lights that generate increased electric fields by causing surface plasmon resonance. The smaller the value of the frequency resolution, the more densely the detectors 46 may be arranged, and thus, further detailed information about light components included in the incident light may be obtained. The spatial resolution may denote a size of a spot that occurred at an interface between the substrate and the dielectric spacer.

Referring to Table 1, in a given spectrometer, it is seen that a frequency resolution is constant regardless of the dopant concentration slope, the frequency of incident light, and the size of the GNM region. Also, in a given spectrometer, as the size of the GNM region increases, the spatial resolution is increased and the average amplitude enhancement is reduced.

Also, as in the first and second spectrometers or the third and fourth spectrometers, when the substrates used in the two spectrometers are the same, it is seen that the frequency resolution is changed according to the change of the concentration and the frequency of incident light. However, like in the first and fourth spectrometers or the second and third spectrometers, when the substrates used in the two spectrometers are different from each other, although the dopant concentrations and the frequencies of incident light of the two spectrometers are different, the frequency resolutions of the two spectrometers may be the same.

According to the results of the Table 1, it is seen that the frequency resolution of the spectrometer may be affected by the dopant concentration of the region having a dopant concentration slope and the frequency of light incident to the spectrometer, but may not be affected by other factors.

The frequency of light incident to the spectrometer is not changed according to an incident angle. Accordingly, the frequency resolution of the spectrometer according to an example embodiment is not affected by an incident angle of incident light. Therefore, the spectrometer according to the present example embodiment may allow a larger incident angle than a spectrometer of the related art that does not utilize surface plasmon resonance.

The spectrometer utilizing surface plasmon resonance according to the present example embodiment advantageously does not require a macroscopic element having a large volume, such as a spectral element or a moving mirror that is required in a spectrometer of the related art. Thus, the spectrometer according to the present example embodiment may be realized on a chip (i.e., in an ON-chip type), and thus, a subminiature spectrometer may be realized.

Also, the spectrometer according to the present example embodiment uses surface plasmon resonance that occurs at an interface between a substrate having a dopant concentration slope and a dielectric spacer, and thus, a spectrum in the spectrometer according to the present example embodiment is dependent on characteristics of the material used but not dependent on the incident angle of incident light. Accordingly, the spectrometer according to the present example embodiment may be independent of the incident angle of incident light, and thus, a spectral analysis with respect to light having a wide incident angle range may be performed. Also, a spectral analysis may be performed with respect to light of a wide wavelength band, for example, from the visible light band to the infrared ray band.

While one or more example embodiments have been described with reference to the figures, it will be understood by those of ordinary skill in the art that various changes in form and details may be made therein without departing from the spirit and scope as defined by the following claims.

What is claimed is:

1. A surface plasmon resonance spectrometer comprising:
   a substrate comprising a region having a permittivity slope and a plurality of doping regions;
   a dielectric spacer configured to correspond to the region having the permittivity slope; and
   a detector configured to face the region having the permittivity slope with the dielectric spacer therebetween,
   wherein each of the plurality of doping regions is spaced apart from a successive doping region by a gap.

2. The spectrometer of claim 1, wherein the region having the permittivity slope comprises a region having a dopant concentration slope.

3. The spectrometer of claim 1, wherein the substrate comprises a semiconductor material.

4. The spectrometer of claim 1, wherein the detector comprises an optical current detector.

5. The spectrometer of claim 1, wherein the detector comprises at least a two-dimensional (2D) material.

6. The spectrometer of claim 1, wherein the detector comprises a plurality of nano-graphene strips arranged directly on the dielectric spacer.

7. The spectrometer of claim 6, wherein both ends of each of the plurality of nano-graphene strips are connected to contact units.

8. The spectrometer of claim 7, wherein the contact units comprise an Au thin film or an Ag thin film.

9. The spectrometer of claim 1, wherein the substrate comprises:
   a first region having a first dopant concentration;
   a second region having a second dopant concentration; and
   a third region between the first region and the second region,
   wherein the third region comprises the region having the permittivity slope.

10. The spectrometer of claim 9, wherein the region having the permittivity slope has a dopant concentration slope.

11. The spectrometer of claim 9, wherein first and second dopant concentrations of the first region and the second region are different from each other.

12. The spectrometer of claim 2, wherein the substrate comprises a semiconductor material.

13. The spectrometer of claim 2, wherein each successive region of the plurality of doping regions has an increased dopant concentration relative to a prior region of the plurality of doping regions.

14. A surface plasmon resonance spectrometer comprising:
   a substrate comprising a first region having a varying permittivity, wherein the varying permittivity varies from a first permittivity to a second permittivity in the first region, and wherein the first region includes a plurality of doping regions;
   a detector adjacent to and facing the first region; and
   a dielectric spacer positioned between the substrate and the detector, the dielectric spacer having a dimension corresponding to at least a dimension of the region having the varying permittivity,
   wherein each of the plurality of doping regions is spaced apart from a successive doping region by a gap.

15. The spectrometer of claim 14, wherein each successive region of the plurality of doping regions has an increased dopant concentration relative to a prior region of the plurality of doping regions.

16. A surface plasmon resonance spectrometer, comprising:
- a substrate comprising a first region having a first dopant concentration, a second region having a second dopant concentration different than the first dopant concentration and a third region having a permittivity slope, wherein the third region is between the first region and the second region and has a dopant concentration slope varying in a first direction from the first region to the second region;
- a dielectric spacer configured to correspond to the region having the permittivity slope; and
- a detector configured to face the region having the permittivity slope with the dielectric spacer therebetween.

17. The spectrometer of claim 16, wherein the dopant concentration slope varies in a linear manner along the first direction.

18. The spectrometer of claim 16, wherein the dopant concentration slope varies in a step-wise manner along the first direction.

19. The spectrometer of claim 16, wherein the third region includes a plurality of doping regions, wherein each of the plurality of doping regions is spaced apart from a successive doping region along the first direction by a gap.

* * * * *